(12) United States Patent
Pernull et al.

(10) Patent No.: US 9,853,655 B1
(45) Date of Patent: Dec. 26, 2017

(54) TESTING A CAPACITOR ARRAY BY DELTA CHARGE

(71) Applicant: Infineon Technologies AG, Neubiberg (DE)

(72) Inventors: Martin Pernull, Villach (AT); Peter Bogner, Wernberg (AT); Sven Derksen, Wernberg (AT); Jaafar Mejri, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/446,495

(22) Filed: Mar. 1, 2017

(51) Int. Cl.
| | |
|---|---|
| H03M 1/10 | (2006.01) |
| H03M 1/80 | (2006.01) |
| H03M 1/12 | (2006.01) |
| H03M 1/00 | (2006.01) |
| G01R 27/26 | (2006.01) |
| G01R 27/02 | (2006.01) |

(52) U.S. Cl.
CPC ....... *H03M 1/1071* (2013.01); *H03M 1/1009* (2013.01); *G01R 27/02* (2013.01); *G01R 27/2605* (2013.01); *H03M 1/00* (2013.01); *H03M 1/12* (2013.01); *H03M 1/804* (2013.01)

(58) Field of Classification Search
CPC .......... H03M 1/12; H03M 1/00; H03M 1/804; G01R 27/2605; G01R 27/02

USPC ......... 341/120, 150, 172; 324/678, 677, 607
See application file for complete search history.

(56) References Cited

U.S. PATENT DOCUMENTS

| | | | |
|---|---|---|---|
| 5,136,251 A * | 8/1992 | George | G01R 27/2605 324/607 |
| 5,889,486 A | 3/1999 | Opris et al. | |
| 7,659,845 B2 | 2/2010 | Bresch | |

FOREIGN PATENT DOCUMENTS

WO      2017005748 A1     1/2017

\* cited by examiner

*Primary Examiner* — Joseph Lauture
(74) *Attorney, Agent, or Firm* — Shumaker & Sieffert, P.A.

(57) ABSTRACT

In some examples, a method includes controlling a first set of switches to deliver a first voltage signal through a first set of capacitors to a common node. The method also includes controlling a second set of switches to deliver a second voltage signal through a second set of capacitors to the common node, wherein the first set of capacitors is electrically connected to the second set of capacitors by the common node. The method further includes measuring a time duration to discharge the common node. The second voltage signal includes an opposing polarity to the first voltage signal.

20 Claims, 7 Drawing Sheets

TESTING A CAPACITOR ARRAY BY DELTA CHARGE

TECHNICAL FIELD

This disclosure relates to capacitor arrays in analog-to-digital converters and other applications.

BACKGROUND

An analog-to-digital (ADC) converter may include a successive-approximation register including a capacitor array of one or more capacitors. The ADC may also include a digital-to-analog converter (DAC) configured to convert a digital voltage signal from the SAR to an analog signal. A comparator of the ADC may compare the analog signal from the DAC to an input analog voltage. The SAR may receive the output of the comparator to update the digital voltage signal that is outputted by the SAR.

SUMMARY

This disclosure describes techniques and devices for testing the capacitances of one or more capacitors in a capacitor array. The testing procedure includes delivering voltage signals through two sets of capacitors to a common node. The testing procedure also includes measuring the time duration to discharge the common node. The voltage signals have opposing polarities, which may cause the net change in voltage at the common node to be less than a change in voltage caused by either of the voltage signals. The net change in voltage may be related to the net electrical charge that is delivered to the common node, which is also known as the delta charge.

In some examples, a method includes controlling a first set of switches to deliver a first voltage signal through a first set of capacitors to a common node. The method also includes controlling a second set of switches to deliver a second voltage signal through a second set of capacitors to the common node, wherein the first set of capacitors is electrically connected to the second set of capacitors by the common node. The method further includes measuring a time duration to discharge the common node. The second voltage signal includes an opposing polarity to the first voltage signal.

In some examples, a device includes a first set of capacitors and a second set of capacitors, wherein the first set of capacitors is electrically connected to the second set of capacitors by a common node. The device also includes processing circuitry configured to control a first set of switches to deliver a first voltage signal through the first set of capacitors to the common node. The processing circuitry is further configured to control a second set of switches to deliver a second voltage signal through the second set of capacitors to the common node, wherein the second voltage signal includes an opposing polarity to the first voltage signal. The processing circuitry is also configured to measure a time duration to discharge the common node.

In some examples, a device including a first set of capacitors and a second set of capacitors, wherein the first set of capacitors is electrically connected to the second set of capacitors by a common node. The device further includes discharge circuitry electrically connected to the common node, and processing circuitry configured to set a voltage at the common node to an offset voltage. The processing circuitry is further configured to control a first set of switches to deliver a first voltage signal through the first set of capacitors to the common node. The processing circuitry is also configured to control a second set of switches to deliver a second voltage signal through the second set of capacitors to the common node, wherein the second voltage signal includes an opposing polarity to the first voltage signal. The processing circuitry is configured to control the discharge circuitry to discharge the common node by a number of voltage steps to the offset voltage. The processing circuitry is further configured to count the number of voltage steps and determine a ratio of capacitances of the first set of capacitors and the second set of capacitors based on the number of voltage steps.

The details of one or more examples are set forth in the accompanying drawings and the description below. Other features, objects, and advantages will be apparent from the description and drawings, and from the claims.

DETAILED DESCRIPTION

Figure 1:
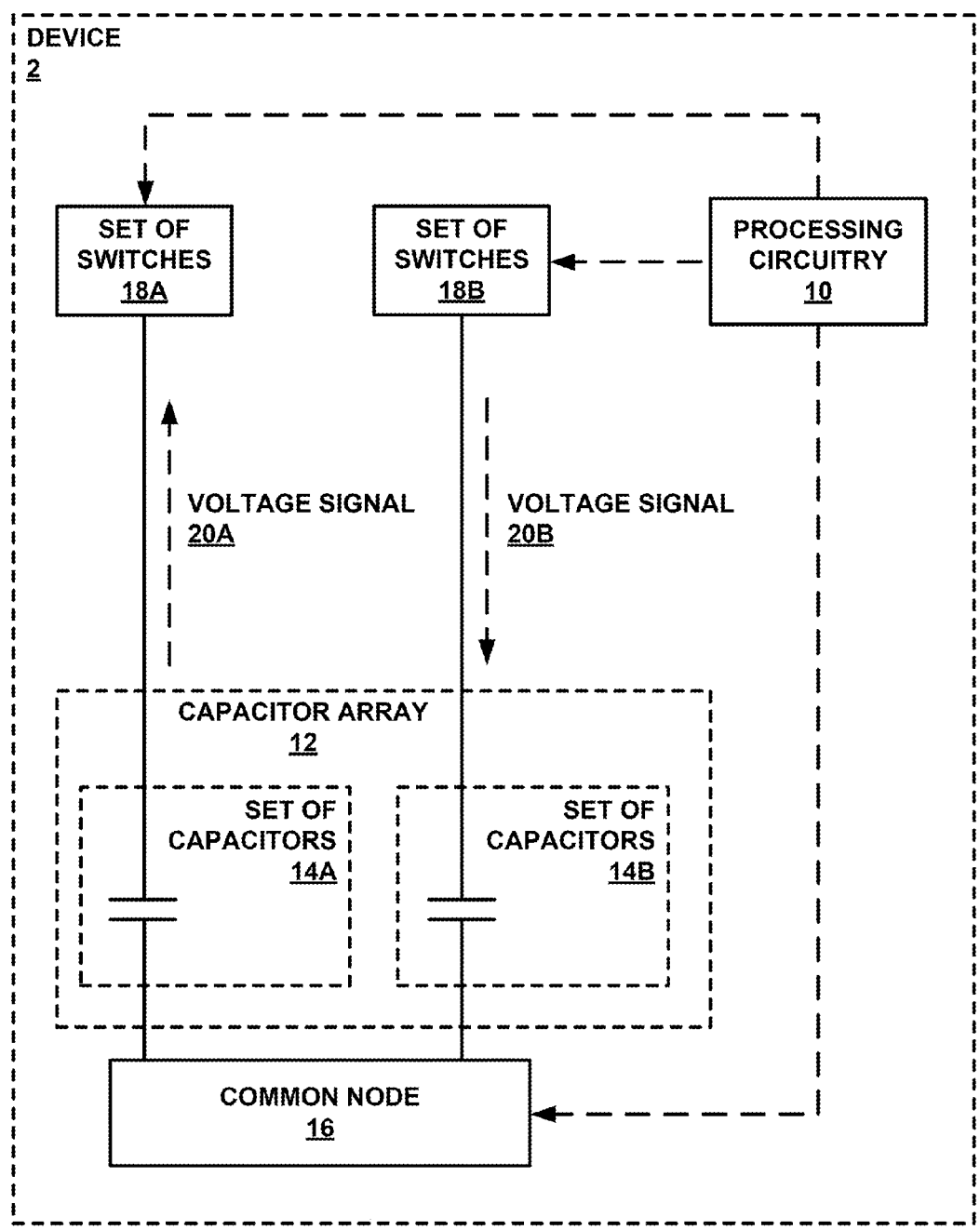
FIG. 1 is a conceptual block diagram of a device including two sets of capacitors electrically connected to a common node, in accordance with some examples of this disclosure.

This disclosure describes circuits and techniques for measuring a discharge time of a delta charge delivered through a first set to capacitors and a second set of capacitors. The techniques may include measuring more than one discharge time for more than one delta charge. The techniques may then include calculating a ratio of the capacitance of the first set of capacitors to the capacitance of the second set of capacitors based on the measured discharge time(s). Processing circuitry may control a first set of switches to deliver a first voltage signal through a first set of capacitors to a common node of the capacitor array. The processing circuitry may control a second set of switches to deliver a second voltage signal through a second set of capacitors to the common node. The common node may be electrically connected to the first set of capacitors and the second set of capacitors. The resulting delta charge at the common node may be based on a difference of the first voltage signal and the second voltage signal. If the voltage signals are equal in amplitude but opposite in polarity, the delta charge at the common node may be based on the ratio of the capacitance of the first set of capacitors to the capacitance of the second set of capacitors. The processing circuitry may determine the ratio of the capacitances by measuring the time duration to discharge the charge at the common node.

By delivering two voltage signals of opposing polarity, the resulting voltage at the common node may be lower, as compared to delivering only one voltage signal to the common node. The time duration to discharge the common node may be shorter as a result of delivering two voltage signals of opposing polarity, as compared to delivering only one voltage signal. When a voltage signal is delivered through a set of larger capacitors, the time duration to discharge the common node may be relatively long. As a result, the total time duration for testing the capacitor array may be reduced by delivering a delta charge to the common node.

The techniques of this disclosure may also reduce the amount of data to store and transfer for the testing procedure. By measuring discharge times of delta charges instead of the discharge times of individual charges, the processing circuitry may estimate the relative capacitance of every capacitor in a capacitor array quickly and easily. In some examples, a device may include less expensive test equipment and less expensive discharge circuitry, while maintaining high precision, as compared to measuring the discharge times of individual charges. The processing circuitry may determine the integral non-linearity and differential non-linearity of the capacitor array based on the ratios of capacitances and the relative capacitances for the capacitor array.

One specific application for these techniques is a capacitor array with thermometer-encoded control signals. It may be impossible or very difficult to access an individual capacitor in a capacitor array with thermometer-encoded control signals. The techniques of this disclosure may allow for a delta charge with a first set of capacitors that includes capacitors one through N and a second set of capacitors that includes capacitors one through N+1.

FIG. 1 is a conceptual block diagram of a device 2 including two sets of capacitors 14A and 14B electrically connected to a common node 16, in accordance with some examples of this disclosure. Device 2 includes processing circuitry 10, capacitor array 12 including sets of capacitors 14A and 14B, common node 16, and sets of switches 18A and 18B. All of the components of device 2 may be part of a single integrated circuit (IC), or device 2 may include one or more ICs and/or discrete components. In some examples, the components of device 2 may be part of a microcontroller circuit and/or a microcontroller package. Device 2 may be used in a variety of applications, including analog-to-digital conversion (ADC) circuitry, temperature sensing circuitry, electronic circuitry, automotive applications, image sensing circuitry, video sensing circuitry, control circuitry, and/or any other application that includes a capacitor array.

Processing circuitry 10 is configured to control set of switches 18A to deliver voltage signal 20A through set of capacitors 14A to common node 16. Processing circuitry 10 may be configured to deliver control signal(s) to set of switches 18A to cause set of switches 18A to open or close. By opening or closing, set of switches 18A may electrically disconnect set of capacitors 14A from a first reference voltage and electrically connect set of capacitors 14A to a second reference voltage. The change in voltage across set of capacitors 14A may deliver voltage signal 20A through set of capacitors 14A to common node 16.

Processing circuitry 10 is also configured to control set of switches 18B to deliver voltage signal 20B through set of capacitors 14B to common node 16. Processing circuitry 10 may be configured to deliver control signal(s) to set of switches 18B to cause set of switches 18B to open or close. By opening or closing, set of switches 18B may electrically disconnect set of capacitors 14B from a second reference voltage and electrically connect set of capacitors 14B to a first reference voltage. The change in voltage across set of capacitors 14B may deliver voltage signal 20B through set of capacitors 14B to common node 16. Voltage signal 20A includes an opposing polarity to voltage signal 20B. The combination of voltages signals 20A and 20B may cause a net charge, also known as a delta charge, to accumulate at common node 16.

Processing circuitry 10 is further configured to measure a time duration to discharge common node 16. Processing circuitry 10 may be configured to set a timer at the beginning of the discharge of common node 16. In some examples, the timer may be a discrete circuit and/or an oscillator. When the discharge of common node 16 finishes or reaches a threshold, processing circuitry 10 may be configured to read the value of the timer to determine the time duration. Processing circuitry 10 may be configured to determine that the discharge has finished by detecting when the voltage at the common node crosses a bias voltage or a reference voltage. The time duration may be proportional to the amplitude of the delta charge at common node 16.

Processing circuitry 10 may be configured to measure the time duration at the time of manufacture. The measurement may be a part of a quality assurance procedure. Additionally or alternatively, processing circuitry 10 may be configured to measure the time duration during the operation of device 2 (i.e., "in the field").

Capacitor array 12 includes sets of capacitors 14A and 14B. Capacitor array 12 may be a part of an ADC circuit that includes two or more capacitors configured to convert an input analog voltage signal to a digital output voltage signal. Capacitor array 12 may include capacitors with varying capacitances. In some examples, each capacitor of capacitor array 12 may represent a bit of a binary number, such that a first capacitor represents one, a second capacitor represents two, a third capacitor represents four, and so on. The capacitors of capacitor array 12 may also have arbitrary capacitances that are not necessarily multiples of two. Each "capacitor" of capacitor array 12 may include more than one capacitor connected in parallel, where the parallel capacitors are configured to operate as a single capacitor.

Each of sets of capacitors 14A and 14B includes one or more capacitors that are connected to common node 16. There may be overlap between set of capacitors 14A and set of capacitors 14B such that a particular capacitor may be included in both sets of capacitors 14A and 14B. In some examples, processing circuitry 10 may be configured to select the capacitors that make up each of sets of capacitors 14A and 14B. Processing circuitry 10 may select a particular capacitor for set of capacitors 14A by sending a control signal to a respective switch that is connected to the particular capacitor. The control signal may cause the respective switch to deliver voltage signal 20A to the particular capacitor. A set of capacitors may include adjacent capacitors and/or non-adjacent capacitors.

Common node 16 is electrically connected to capacitor array 12. A node of each capacitor in capacitor array 12 may be electrically connected to common node 16. Common node 16 may be electrically connected to circuitry that allows the voltage at common node 16 to discharge. Processing circuitry 10 may control the circuitry to cause common node 16 to discharge after sets of switches 18A and 18B have delivered voltage signals 20A and 20B.

Sets of switches 18A and 18B are configured to deliver voltage signals 20A and 20B based on control signals received from processing circuitry 10. For example, set of switches 18A may include one or more switches that are electrically connected to the one or more respective capacitors of set of capacitors 14A. In some examples, the switches of sets of switches 18A and 18B may include one or more voltage-controlled elements such as transistors. Each switch of sets of switches 18A and 18B may be configured to deliver a voltage signal by switching a respective capacitor of capacitor array 12 from a first reference voltage to a second reference voltage. Sets of switches 18A and 18B may be configured to deliver voltage signals 20A and 20B concurrently or at different times. In some examples, the order of delivery of voltage signals 20A and 20B may not be critical to the techniques of this disclosure.

Voltage signals 20A and 20B are delivered to sets of capacitors 14A and 14B by sets of switches 18A and 18B. Each of voltage signals 20A and 20B may be a change in voltage caused by the operation of sets of switches 18A and 18B. The capacitors of sets of capacitors 14A and 14B may allow higher-frequency signals to pass, while blocking lower-frequency signals. Voltage signals 20A and 20B may include higher-frequency signals caused by sets of switches 18A and 18B switching from a first reference voltage to a second reference voltage, or vice versa. Voltage signals 20A and 20B may have opposing polarities, such that the change in voltage at common node 16 caused by voltage signal 20A at least partially offsets the change in voltage at common node 16 caused by voltage signal 20B.

In accordance with the techniques of this disclosure, processing circuitry 10 is configured to control sets of switches 18A and 18B to deliver voltage signals 20A and 20B through sets of capacitors 14A and 14B. Voltage signals 20A and 20B may together cause the voltage at common node 16 to change in proportion to the delta charge at common node 16. Processing circuitry 10 is further configured to discharge the voltage at common node 16 back to a reference voltage or a bias voltage. The time duration to discharge may be proportional to the delta charge caused by the delivery of voltage signals 20A and 20B. The resulting voltage at common node 16 may take a shorter time duration to discharge, as compared to a change in voltage caused by only one voltage signal.

Figure 2:
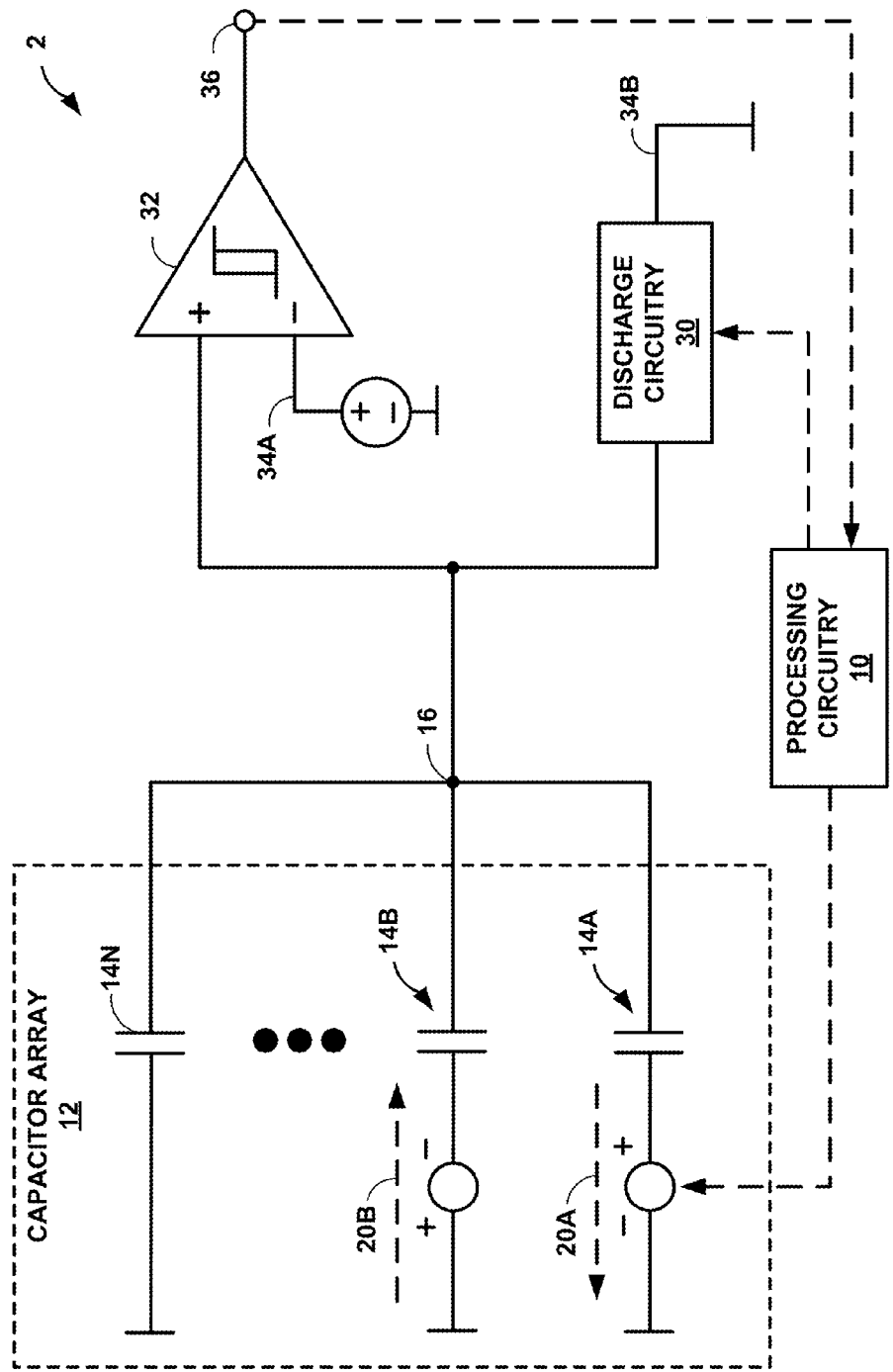
FIG. 2 is a conceptual diagram of the device of FIG. 1 further including discharge circuitry and a comparator, in accordance with some examples of this disclosure.

FIG. 2 is a conceptual diagram of device 2 of FIG. 1 further including discharge circuitry 30 and a comparator 32, in accordance with some examples of this disclosure. Processing circuitry 10 may be configured to control discharge circuitry 30 to discharge common node 16. Processing circuitry 10 may also be configured to detect the voltage at node 36 to determine a crossing of the voltage at common node 16.

Capacitor array 12 may include sets of capacitors 14A-14N. In some examples, sets of capacitors 14A and 14B may each include a single capacitor of capacitor array 12 or multiple capacitors of capacitor array 12. For example, set of capacitors 14A may be the largest capacitor of capacitor array 12, and set of capacitors 14B may be the second-largest capacitor of capacitor array 12. In some examples, set of capacitors 14A may be the largest capacitor of capacitor array 12, and set of capacitors 14B may include the second-largest capacitor and the third-largest capacitor of capacitor array 12. FIG. 2 depicts sets of capacitors 14A-14N as single capacitors, but sets of capacitors 14A-14N may include more than one capacitor in some examples. In some examples, processing circuitry 10 may select adjacent and/or non-adjacent capacitors as a set of capacitors.

In some examples, voltage signals 20A and 20B may include approximately equal amplitudes and opposing polarities. For example, processing circuitry 10 may be configured to switch set of capacitors 14A from a first reference voltage to a second reference voltage and to switch set of capacitors 14B from the second reference voltage to the first reference voltage. The resulting change in voltage at common node 16 may be proportional to the difference between the capacitance of set of capacitors 14A and the capacitance of set of capacitors 14B. For example, voltage signal 20A may cause the voltage at common node 16 to increase by two volts, and voltage signal 20B may cause the voltage at common node 16 to decrease by one volt. In this example, the net voltage at common node 16 may increase by one volt. Therefore, the voltage change at common node 16 may be lower for both of voltage signals 20A and 20B, as compared to the voltage change caused by voltage signal 20A alone.

Discharge circuitry 30 may be electrically connected to common node 16. In some examples, discharge circuitry 30 may be configured to discharge the voltage at common node 16 by a number of voltage steps, which may also be referred to as charge steps, to offset voltage 34B. Discharge circuitry 30 may include a capacitor that is charged and discharged to remove charge from common node 16 or supply charge to common node 16. Each charge-and-discharge cycle for discharge circuitry 30 may cause a voltage step at common node 16. Processing circuitry 10 may be configured to measure the time duration for common node 16 to discharge by voltage steps because each charge-and-discharge cycle may have a defined time period.

In some examples, discharge circuitry 30 may be configured to discharge the voltage (i.e., the delta charge) at common node 16 by supplying or sinking an electrical current. Processing circuitry 10 may be configured to control an electrical bus, such as a direct-current (DC) electrical bus, to supply an electrical current to common node 16 or to sink an electrical current from common node 16. Processing circuitry 10 may deliver control signals to a switch to selectively connect or disconnect the electrical bus to common node 16. Processing circuitry 10 may be configured to measure the time duration for common node 16 to discharge by the electrical current.

In some examples, discharge circuitry 30 may be configured to discharge the voltage at common node 16 by supplying or sinking electrical current through a resistor. Processing circuitry 10 may be configured to electrically connect common node 16 to the resistor. Processing circuitry 10 may be configured to measure the time duration to discharge common node 16 by the electrical current through the resistor.

Comparator 32 may be configured to detect a crossing of the voltage at common node 16 and offset voltage 34A. Comparator 32 may include circuitry configured to compare the voltage at common node 16 to offset voltage 34A. Comparator 32 may be configured to output a higher voltage if the voltage at common node 16 is higher than offset voltage 34A. When the voltage at common node 16 discharges to an amplitude that is lower than offset voltage 34A, comparator 32 may be configured to output a lower voltage. As a result, the output voltage of comparator 32 may indicate when common node 16 discharges to offset voltage 34A, which may be referred to as a voltage crossing, a zero crossing, an offset crossing, or a bias voltage crossing. In some examples, offset voltages 34A and 34B may have the same voltage levels or different voltage levels. The techniques of this disclosure may result in a lower delta charge at common node 16, which may reduce the likelihood of an overvoltage at the non-inverting input node of comparator 32.

Figure 3:
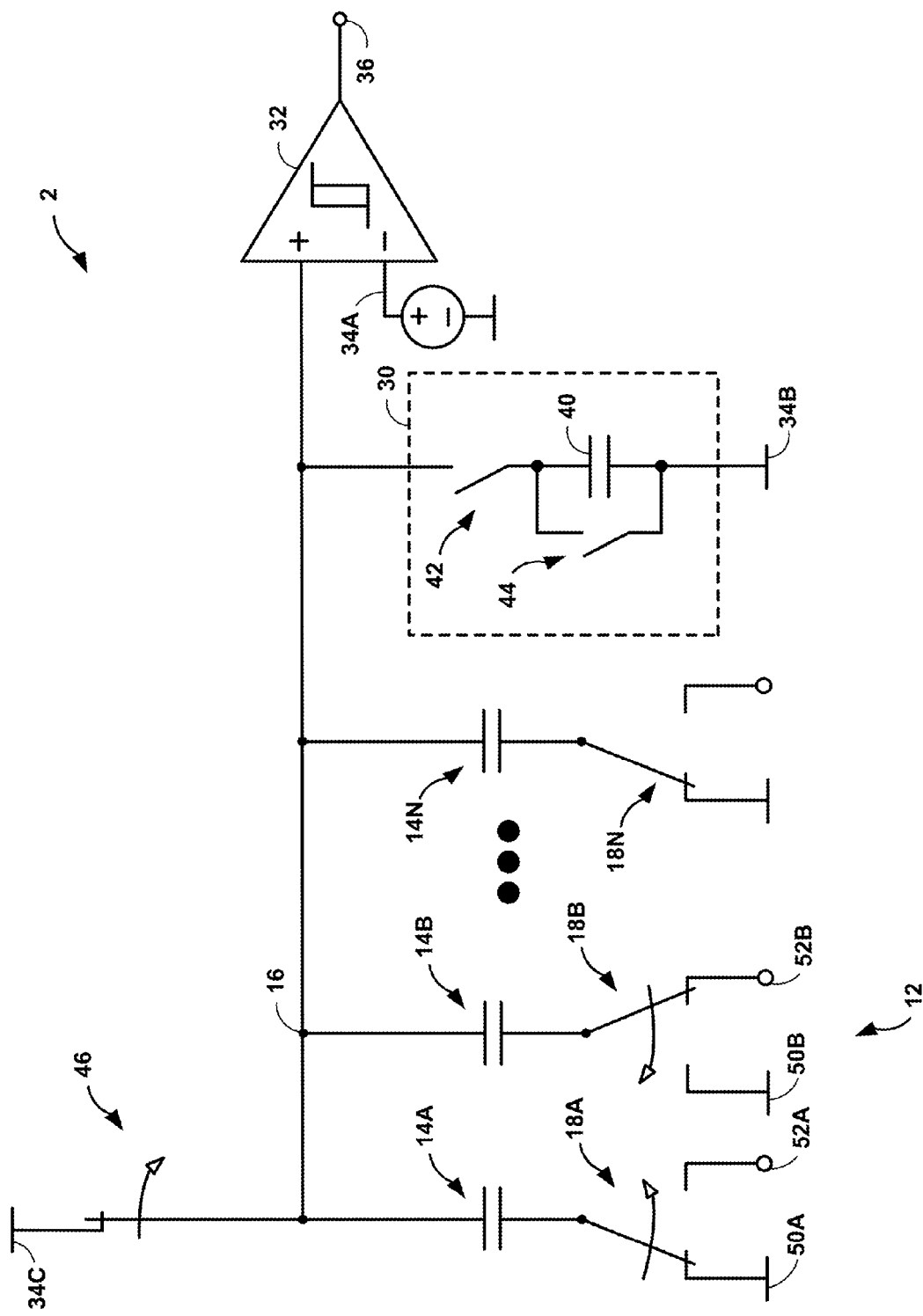
FIG. 3 is a conceptual diagram of the device of FIGS. 1 and 2 including further details, in accordance with some examples of this disclosure.

FIG. 3 is a conceptual diagram of device 2 of FIGS. 1 and 2 including further details, in accordance with some examples of this disclosure. FIG. 3 depicts capacitor array 12 as including only sets of capacitors 14A and 14B, but capacitor array 12 may include additional sets of capacitors. Additionally or alternatively, set of capacitors 14A and/or set of capacitors 14B may include one capacitor or multiple capacitors.

Discharge circuitry 30 may include discharge capacitor 40 and discharge switches 42 and 44. In some examples, discharge circuitry 30 may be configured to discharge common node 16 by connecting common node 16 to an electrical bus and/or a resistor, in addition to or as an alternative to discharge capacitor 40. In some examples, discharge circuitry 30 may be configured to discharge common node 16 by a number of voltage steps, where each voltage step is a charge-and-discharge cycle. A charge-and-discharge cycle may include a first state where discharge switch 42 is closed and discharge switch 44 is open so that common node 16 is electrically connected to the upper node of discharge capacitor 40. The charge-and-discharge cycle may include a second state where discharge switch 42 is open and discharge switch 44 is closed so that common node 16 is electrically disconnected from the upper node of discharge capacitor 40. During the second state, the upper node of discharge capacitor 40 may be electrically connected to the lower node of discharge capacitor 40, and the upper node of discharge capacitor 40 may discharge to a voltage source or sink, such as offset voltage 34B. Processing circuitry 10 may also be configured to control discharge switch 42 to selectively electrically connect common node 16 and the upper node of discharge capacitor 40. Processing circuitry 10 may be configured to count the charge-and-discharge cycles, count the voltage steps, and/or measure the time duration to discharge common node 16.

Switch 46 may be configured to electrically connect or disconnect common node 16 from offset voltage 34C. Processing circuitry 10 may be configured to close switch 46 to electrically connect common node 16 to offset voltage 34C before each test of capacitor array 12. Processing circuitry 10 may be configured to subsequently open switch 46 to electrically disconnect common node 16 from offset voltage 34C when the voltage at common node 16 has charged to offset voltage 34C. Processing circuitry 10 may be configured to begin a test of capacitor array 12 after switch 46 has opened so that voltage signals 20A and 20B change the voltage at common node 16 from a starting point of offset voltage 34C. In some examples, offset voltages 34A-34C may have the same voltage levels or different voltage levels. In some examples, two of offset voltages 34A-34C may have the same voltage levels, and the third voltage of offset voltages 34A-34C may have a different voltage level.

Sets of switches 18A and 18B may be configured to electrically connect sets of capacitors 14A and 14B to either first reference voltage 50A and 50B or second reference voltage 52A and 52B. Processing circuitry 10 may be configured to control set of switches 18A to electrically disconnect a node of set of capacitors 14A from reference voltage 50A and electrically connect the node to reference voltage 52A. Switching set of capacitors 14A from reference voltage 50A to reference voltage 52A may deliver voltage signal 20A through set of capacitors 14A to common node 16. Processing circuitry 10 may be configured to control set of switches 18B to electrically disconnect set of capacitors 14B from reference voltage 52B and electrically connect the node to reference voltage 50B. Switching the node of set of capacitors 14B from reference voltage 52B to reference voltage 50B may deliver voltage signal 20B through set of capacitors 14B to common node 16. Processing circuitry 10 may control sets of switches 18A and 18B simultaneously or non-simultaneously.

Figure 4:
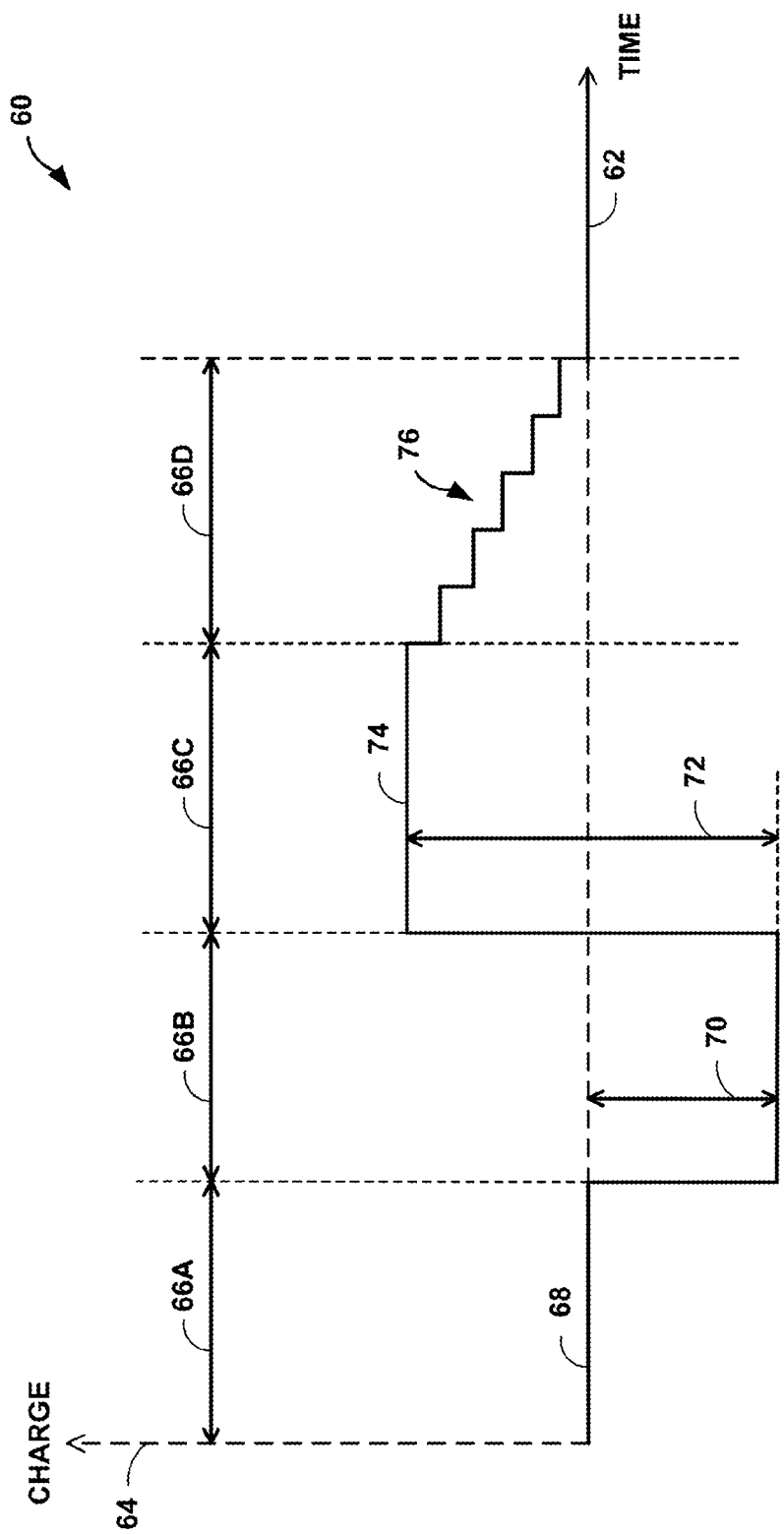
FIG. 4 is a graph of a procedure for measuring the discharge time of the delta charge for two sets of capacitors, in accordance with some examples of this disclosure.

FIG. 4 is a graph 60 of a procedure for measuring the discharge time of the delta charge for two sets of capacitors, in accordance with some examples of this disclosure. Horizontal axis 62 represents time, and vertical axis 64 represents charge or voltage at common node 16. During time period 66A, the voltage at common node 16 may be equal to offset voltage 68. Processing circuitry 10 may close switch 46 to connect common node 16 to offset voltage 34C and then open switch 46 so that the upper node of each capacitor is floating. During time period 66B, the charge at common node 16 may decrease by charge amplitude 70 because of the delivery of voltage signal 20B to common node 16. During time period 66C, the charge at common node 16 may increase by charge amplitude 72 to charge amplitude 74 because of the delivery of voltage signal 20B to common node 16. Charge amplitude 72 may be greater than charge amplitude 70 because the capacitance of set of capacitors 14A is greater than the capacitance of set of capacitors 14B. Charge amplitude 74 may be proportional to the difference of charges of sets of capacitors 14A and 14B. Charge amplitude 74 may be referred to as the delta charge. Charge amplitude 70, 72, and 74 may be a function of voltage signals 20A and 20B and the capacitances, as shown in equations (2)-(4) below. Equations (2)-(4) are based on the relationship between charge Q, capacitance C, and voltage V shown in equation (1).

$$Q = C \times V \tag{1}$$

$$\text{Charge of charge amplitude } 70 = -C_{14B} \times V_{ref} \tag{2}$$

$$\text{Charge of charge amplitude } 72 = C_{14A} \times V_{ref} \tag{3}$$

$$\text{Charge of charge amplitude } 74 = (C_{14A} - C_{14B}) \times V_{ref} \tag{4}$$

During time period 66D, processing circuitry 10 may cause common node 16 to discharge by one or more charge steps 76. Charge steps 76 may also be referred to as voltage steps 76. Processing circuitry 10 may be configured to count the number of charge steps 76 and/or measure the time duration to discharge common node 16. In some examples, common node 16 may discharge through an electrical bus and/or a resistor such that the discharge during time period 66D is linear or approximated as linear. After common node 16 has discharged to offset voltage 68C, processing circuitry 10 may be configured to close switch 46 to reconnect common node 16 with offset voltage 34C. Processing circuitry 10 may be configured to select two sets of capacitors from capacitor array 12 for another test of the delta charge at common node 16 caused by delivering voltage signals 20A and 20B through the two sets of capacitors 14A and 14B.

In some examples, the ratio between the largest capacitor and the smallest capacitor in a capacitor array may be one hundred, one thousand, or more. To increase the accuracy of measuring the capacitance of the smallest capacitor, a device may implement smaller charge steps or a lower-amplitude electrical current. The device may also apply a dither noise signal for oversampling to increase the accuracy. Using smaller charges steps or a lower-amplitude electrical current, the discharge time for the largest capacitor may be relatively long. To reduce this time duration, processing circuitry 10 using matrix 100 may control switches to cause the delivery of a positive voltage signal through the largest capacitor and negative voltage signal through the second- and third-largest capacitors in the capacitor array. The net change in voltage at common node 16 may be less than the change in voltage caused by delivery of only a positive voltage signal through the largest capacitor.

Figure 5:
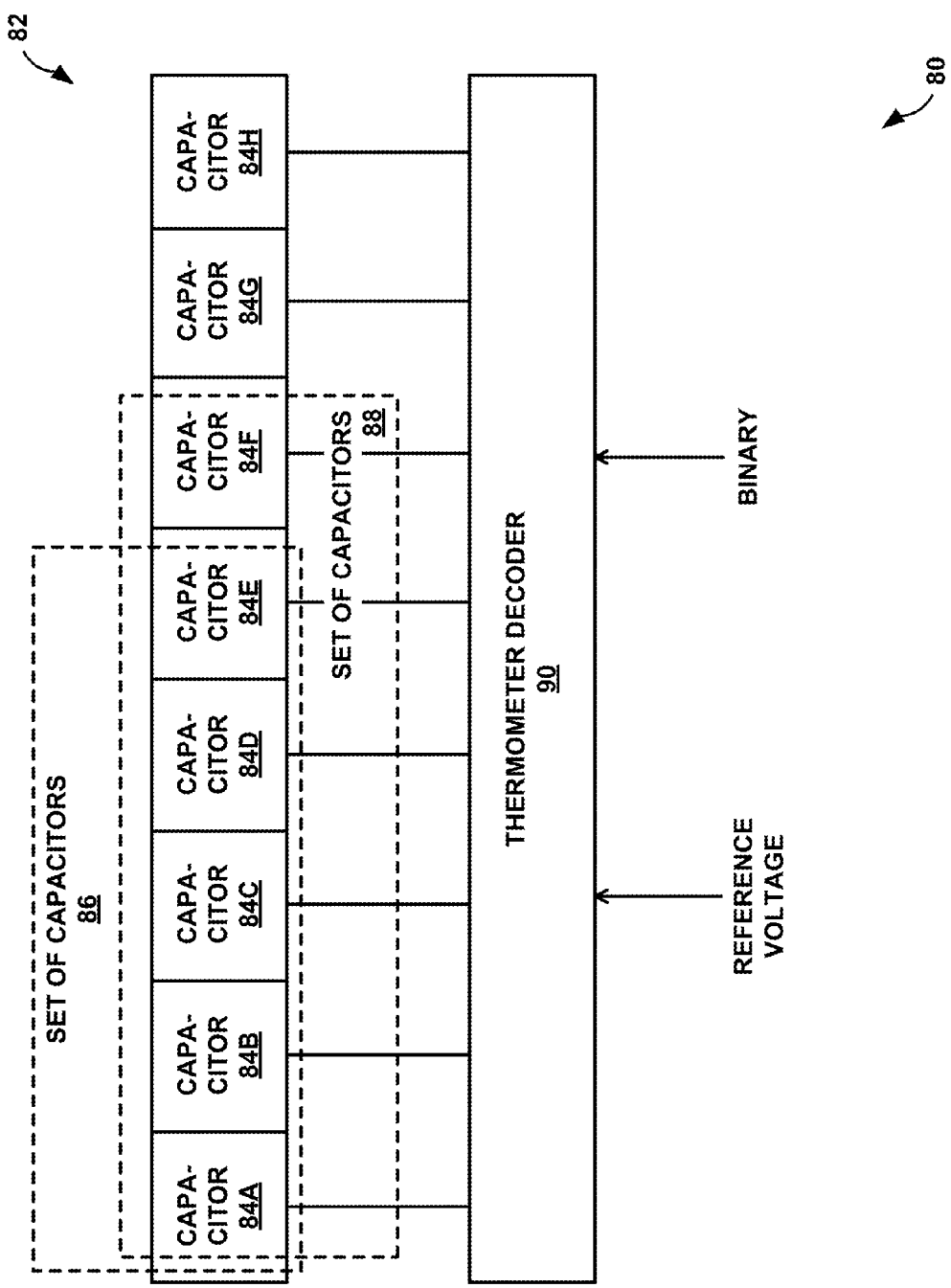
FIG. 5 is a conceptual block diagram of a capacitor array with thermometer encoded control signals, in accordance with some examples of this disclosure.

FIG. 5 is a conceptual block diagram of a capacitor array 82 with thermometer encoded control signals, in accordance with some examples of this disclosure. Device 80 may include capacitor array 82 including capacitors 84A-84H and thermometer decoder 90. It may be difficult to measure ratios of capacitances of set of capacitors 86 and set of capacitors 88 in device 80 because thermometer decoder 90 may prevent accessing an individual capacitor of capacitors 84A-84H.

The processing circuitry of device 80 may measure the capacitance of capacitor 84F by delivering a first voltage signal through set of capacitors 86 and delivering a second voltage signal with an opposing polarity through set of capacitors 88. Set of capacitors 86 may include capacitors 84A-84E, and set of capacitors 88 may include capacitors 84A-84F. In some examples, the processing circuitry of a device may include a matrix with values for each switch that is connected to a capacitor array. The values in the matrix indicate the amplitude and the polarity of the voltage signals caused by the switching process. For example, a positive value in the matrix may indicate a positive voltage signal to be delivered by the switch to a respective capacitor.

Figure 6:
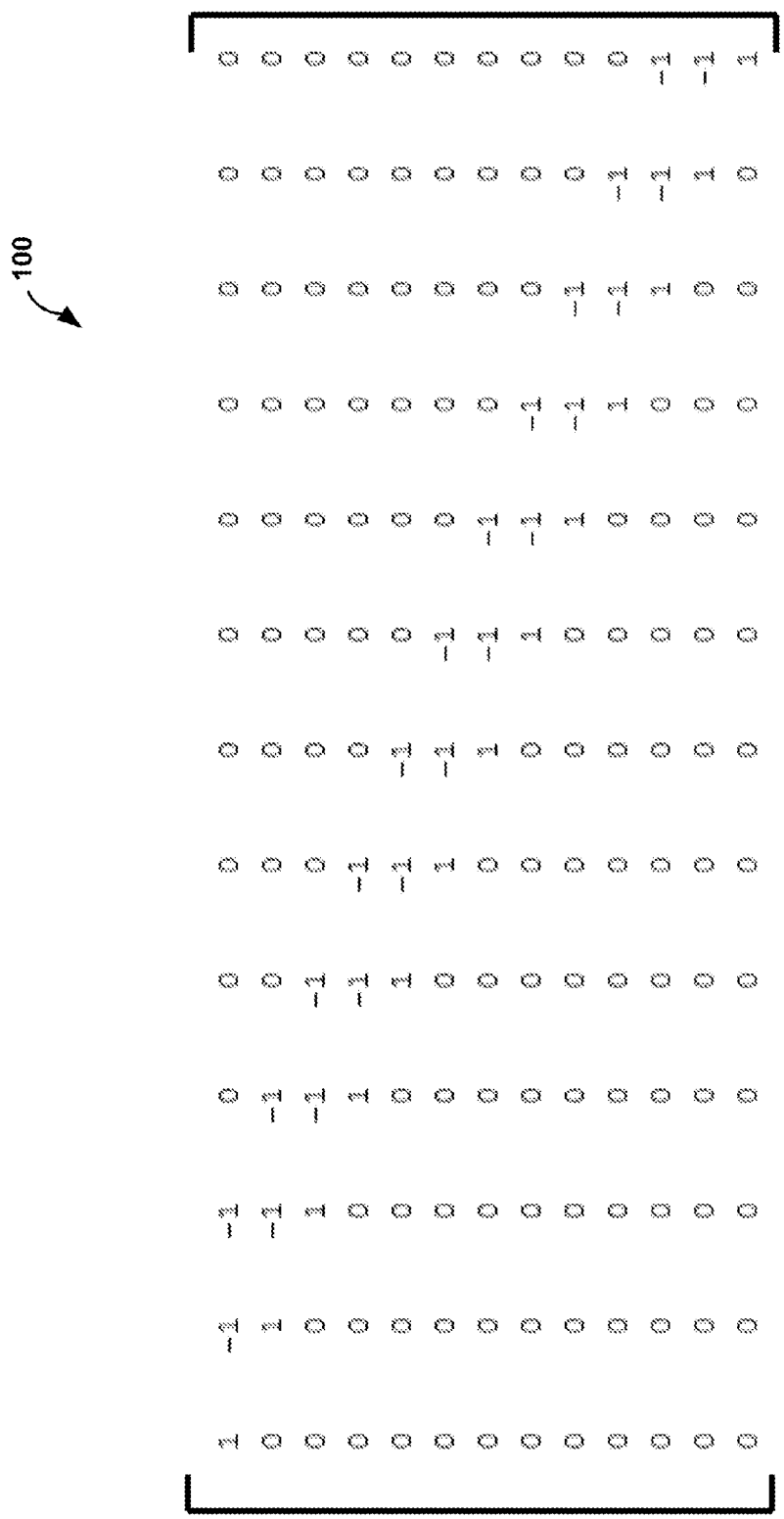
FIG. 6 shows a matrix for testing a capacitor array by delta charge, in accordance with some examples of this disclosure.

FIG. 6 shows a matrix 100 for testing a capacitor array by delta charge, in accordance with some examples of this disclosure. Each row of matrix 100 represents a testing procedure for a capacitor array. Each column of matrix 100 represents a capacitor in the capacitor array. In the first row of matrix 100, a positive voltage signal is delivered through the largest capacitor and a negative voltage signal is delivered through the second-largest capacitor and through the third-largest capacitor. In the first row, the first set of capacitors includes the largest capacitor, and the second set of capacitors includes the second-largest capacitor and the third-largest capacitor. The first row may result in a measurement of the discharge time of the delta charge for the first set of capacitors and the second set of capacitors. The delta charge, also known as the net charge, at the common node may be calculated by equation (5). If the three voltage signals ($\Delta V_1$, $\Delta V_2$, $\Delta V_3$) are equal in amplitude, the delta charge may be calculated by equation (6).

$$\Delta Q = C_1 \Delta V_1 - C_2 \Delta V_2 - C_3 \Delta V_3 \quad (5)$$

$$\Delta Q = \Delta V \times (C_1 - C_2 - C_3) \quad (6)$$

In the second row of matrix 100, a positive voltage signal is delivered through the second-largest capacitor and a negative voltage signal is delivered through the third-largest capacitor and through the fourth-largest capacitor. The second row may result in a measurement of the delta charge caused by a voltage signal delivered through the second-largest capacitor and a voltage signal delivered through the third-largest capacitor and the fourth-largest capacitor. In the final row of matrix 100, a positive voltage signal is delivered through the smallest capacitor. The final row may result in a measurement of a time duration associated with the capacitance of the smallest capacitor. In addition, processing circuitry 10 may be configured to conduct multiple rounds of testing and filter the results to reduce the variation in the determined ratios of capacitances or oversampling.

Processing circuitry 10 may be configured to determine the relative capacitances based on the time durations from each row of testing. The relative capacitances may be a percentage of the total capacitance of the capacitor array. Processing circuitry 10 may be configured to determine the relative capacitances by multiplying the inverse of matrix 100 by a vector of the time durations. Processing circuitry 10 may be configured to first measure the time duration for every row of matrix 100. After measuring every time duration, processing circuitry 10 may then calculate the relative capacitances of each of the capacitors in the capacitor array. Processing circuitry 10 may be configured to determine whether the ratio of capacitances from each test is within an error tolerance of a target ratio. Processing circuitry 10 may also be configured to determine whether the relative capacitance of each capacitor is within an error tolerance of a target relative capacitance.

If processing circuitry 10 determines that a ratio of capacitances is within the error tolerance, processing circuitry 10 may be configured to store the ratio of capacitances in a memory device of device 2. Processing circuitry 10 may be further configured to modify a result of an ADC conversion based on the stored ratio of capacitances. The ADC conversion may be based on an input voltage signal and the charge on each capacitor of capacitor array 12. The stored ratio of capacitances may improve the conversion result if the stored ratio is different than the target ratio.

If processing circuitry 10 determines that a ratio of capacitances is not within the error tolerance, processing circuitry 10 may be configured to set a flag in a register. In some examples, the register may be a status register in the data memory of a microcontroller. Processing circuitry 10 may be configured to output a warning to a user based on the flag being set. The warning may indicate to the user that the capacitor array is no longer within the error tolerance.

Figure 7:
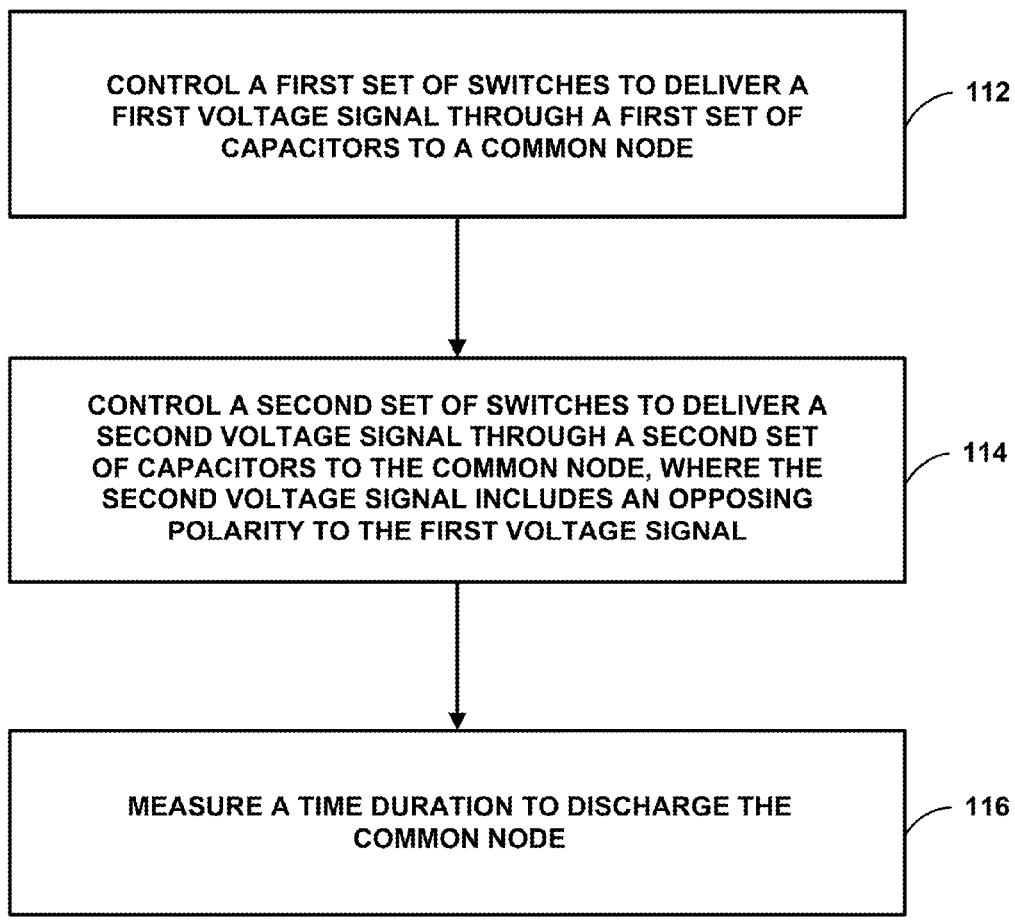
FIG. 7 is a flowchart illustrating a technique for measuring a discharge time of a delta charge for two sets of capacitors, in accordance with some examples of this disclosure.

FIG. 7 is a flowchart illustrating a technique for measuring a discharge time of a delta charge for two sets of capacitors, in accordance with some examples of this disclosure. The technique of FIG. 7 is described with reference to device 2 of FIGS. 1-3, although other components, such as device 80 in FIG. 5, may exemplify similar techniques. Device 2 and processing circuitry 10 may be configured to perform the testing procedure of FIG. 7 at the time of manufacture. Additionally or alternatively, device 2 and processing circuitry 10 may be configured to perform the testing procedure of FIG. 7 in during the operational life of device 2 as a built-in self-test (BIST).

The technique of FIG. 7 includes controlling set of switches 18A to deliver voltage signal 20A through set of capacitors 14A to common node 16 (112). Processing circuitry 10 may be configured to deliver control signal(s) to set of switches 18A to cause set of switches 18A to open or close. By opening or closing, set of switches 18A may electrically disconnect set of capacitors 14A from a first reference voltage and electrically connect set of capacitors 14A to a second reference voltage. The change in voltage across set of capacitors 14A may deliver voltage signal 20A through set of capacitors 14A to common node 16.

The technique of FIG. 7 further includes controlling set of switches 18B to deliver voltage signal 20B through set of capacitors 14B to common node 16 (114). Set of capacitors 14A is electrically connected to set of capacitors 14B by common node 16, and wherein voltage signal 20A includes an opposing polarity to voltage signal 20B (114). Processing circuitry 10 may be configured to deliver control signal(s) to set of switches 18B to cause set of switches 18B to open or close. By opening or closing, set of switches 18B may electrically disconnect set of capacitors 14B from a first reference voltage and electrically connect set of capacitors 14B to a second reference voltage. The change in voltage across set of capacitors 14B may deliver voltage signal 20B through set of capacitors 14B to common node 16. Voltage signal 20A includes an opposing polarity to voltage signal 20B.

The technique of FIG. 7 further includes measuring a time duration to discharge common node 16 (116). Processing circuitry 10 may be configured to set a timer at the beginning of the discharge of common node 16. In some examples, the timer may be a discrete circuit, a clocked counter, and/or an oscillator. When the discharge of common node 16 finishes or reaches a threshold, processing circuitry 10 may be configured to read the value of the timer to determine the time duration. Processing circuitry 10 may be configured to determine that the discharge has finished by detecting when the voltage at the common node crosses a bias voltage or a reference voltage.

In some examples, the techniques of this disclosure may be implemented in a single-ended circuit such as device 2. In some examples, device 2 may include only a single reference voltage, where the difference between the reference voltage and a ground voltage is used to deliver voltage signals 20A and 20B. A device may also include a capacitor array in a differential arrangement, where there are two reference voltages that may be adjusted.

The techniques of this disclosure may be implemented in a device or article of manufacture comprising a computer-readable storage medium. The term "processing circuitry," as used herein may refer to any of the foregoing structure or any other structure suitable for processing program code and/or data or otherwise implementing the techniques described herein. Elements of device 2 and/or processing circuitry 10 may be implemented in any of a variety of types of solid state circuit elements, such as CPUs, CPU cores, GPUs, digital signal processors (DSPs), application-specific integrated circuits (ASICs), a mixed-signal integrated circuits, field programmable gate arrays (FPGAs), microcontrollers, programmable logic controllers (PLCs), programmable logic device (PLDs), complex PLDs (CPLDs), a system on a chip (SoC), any subsection of any of the above, an interconnected or distributed combination of any of the above, or any other integrated or discrete logic circuitry, or any other type of component or one or more components capable of being configured in accordance with any of the examples disclosed herein. Processing circuitry may also include analog components arranged in a mixed-signal IC.

Device 2 and/or processing circuitry 10 may include memory. One or more memory devices of the memory may include any volatile or non-volatile media, such as a RAM, ROM, non-volatile RAM (NVRAM), electrically erasable programmable ROM (EEPROM), flash memory, and the like. One or more memory devices of the memory may store computer readable instructions that, when executed by the processing circuitry, cause the processing circuitry to implement the techniques attributed herein to the processing circuitry.

Elements of device 2 and/or processing circuitry 10 may be programmed with various forms of software. The processing circuitry may be implemented at least in part as, or include, one or more executable applications, application modules, libraries, classes, methods, objects, routines, subroutines, firmware, and/or embedded code, for example. The processing circuitry may be configured to receive voltage signals, determine switching frequencies, and deliver control signals.

The techniques of this disclosure may be implemented in a wide variety of computing devices. Any components, modules or units have been described to emphasize functional aspects and does not necessarily require realization by different hardware units. The techniques described herein may be implemented in hardware, software, firmware, or any combination thereof. Any features described as modules, units or components may be implemented together in an integrated logic device or separately as discrete but interoperable logic devices. In some cases, various features may be implemented as an integrated circuit device, such as an integrated circuit chip or chipset.

The following numbered examples demonstrate one or more aspects of the disclosure.

Example 1

A method includes controlling a first set of switches to deliver a first voltage signal through a first set of capacitors to a common node. The method also includes controlling a second set of switches to deliver a second voltage signal through a second set of capacitors to the common node, wherein the first set of capacitors is electrically connected to the second set of capacitors by the common node. The method further includes measuring a time duration to discharge the common node. The second voltage signal includes an opposing polarity to the first voltage signal.

Example 2

The method of example 1, wherein controlling the first set of switches includes switching a second node of the first set of capacitors from a first reference voltage to a second reference voltage, and wherein controlling the second set of switches includes switching a second node of the second set of capacitors from the second reference voltage to a first reference voltage.

Example 3

The method of examples 1-2 or any combination thereof, further including controlling discharge circuitry to discharge the common node by a number of voltage steps, wherein the discharge circuitry is electrically connected to the common node, and wherein measuring the time duration includes counting the number of voltage steps.

Example 4

The method of examples 1-3 or any combination thereof, wherein controlling the discharge circuitry to discharge the common node includes controlling a first discharge switch of the discharge circuitry to selectively electrically connect the common node to a first node of a discharge capacitor of the discharge circuitry. Controlling the discharge circuitry to discharge the common node also includes controlling a second discharge switch of the discharge circuitry to selectively electrically connect the first node of the discharge capacitor to a reference voltage Example 5

The method of examples 1-4 or any combination thereof, further including controlling discharge circuitry to discharge the common node by controlling an electrical bus to supply an electrical current to the common node or sink an electrical current from the common node, wherein the discharge circuitry is electrically connected to the common node.

Example 6

The method of examples 1-5 or any combination thereof, further including controlling discharge circuitry to discharge the common node by electrically connecting the common node to a resistor, wherein the discharge circuitry is electrically connected to the common node.

Example 7

The method of examples 1-6 or any combination thereof, further including setting a voltage at the common node to an offset voltage before controlling the first set of switches to deliver the first voltage signal and before controlling the second set of switches to deliver the second voltage signal, and wherein measuring the time duration includes determining a time duration to discharge an electrical charge at the common node caused by the first voltage signal and the second voltage signal.

Example 8

The method of examples 1-7 or any combination thereof, further including determining a ratio of capacitances of the first set of capacitors and the second set of capacitors based on the time duration and determining whether the ratio of capacitances of the first set of capacitors and the second set of capacitors is within an error tolerance of a target ratio Example 9

The method of examples 1-8 or any combination thereof, further including setting a flag in a register based on determining whether the ratio of capacitances of the first set of capacitors and the second set of capacitors is within the error tolerance of the target ratio. The method further includes outputting a warning based on the flag.

Example 10

The method of examples 1-9 or any combination thereof, further including storing the ratio of capacitances of the first set of capacitors and the second set of capacitors in a memory device and modifying a result of an analog-to-digital conversion based on the stored ratio of capacitances.

Example 11

A device includes a first set of capacitors and a second set of capacitors, wherein the first set of capacitors is electrically connected to the second set of capacitors by a common node. The device also includes processing circuitry configured to control a first set of switches to deliver a first voltage signal through the first set of capacitors to the common node. The processing circuitry is further configured to control a second set of switches to deliver a second voltage signal through the second set of capacitors to the common node, wherein the second voltage signal includes an opposing polarity to the first voltage signal. The processing circuitry is also configured to measure a time duration to discharge the common node.

Example 12

The device of example 11, wherein the processing circuitry is configured to control the first set of switches by at least switching a second node of the first set of capacitors from a first reference voltage to a second reference voltage. The processing circuitry is configured to control the second set of switches by at least switching a second node of the second set of capacitors from the second reference voltage to the first reference voltage Example 13

The device of examples 11-12 or any combination thereof, further including discharge circuitry electrically connected to the common node, wherein the processing circuitry is further configured to control the discharge circuitry to discharge the common node by a number of voltage steps and count the number of voltage steps.

Example 14

The device of examples 11-13 or any combination thereof, wherein the discharge circuitry includes a discharge capacitor, a first discharge switch, and a second discharge switch, and wherein the processing circuitry is further configured to control the first discharge switch to selectively electrically connect the common node to a first node of the discharge capacitor. The processing circuitry is further configured to control the second discharge switch to selectively electrically connect the first node of the discharge capacitor to a reference voltage.

Example 15

The device of examples 11-14 or any combination thereof, further including discharge circuitry electrically connected to the common node, wherein the processing circuitry is further configured to control the discharge circuitry to discharge the common node by controlling an electrical bus to supply an electrical current to the common node or sink an electrical current from the common node.

Example 16

The device of examples 11-15 or any combination thereof, further including discharge circuitry electrically connected to the common node, wherein the processing circuitry is further configured to control the discharge circuitry to discharge the common node by electrically connecting the common node to a resistor.

Example 17

The device of examples 11-16 or any combination thereof, wherein the processing circuitry is further configured to set a voltage at the common node to an offset voltage before controlling the first set of switches to deliver the first voltage signal and before controlling the second set of switches to deliver the second voltage signal, the device further including a comparator configured to detect when the voltage at the common node has discharged to the offset voltage, wherein the processing circuitry is configured to measure the time duration by at least determining a time duration to discharge an electrical charge at the common node caused by the first voltage signal and the second voltage signal to the offset voltage.

Example 18

The device of examples 11-17 or any combination thereof, wherein the processing circuitry is further configured to determine a ratio of capacitances of the first set of capacitors and second set of capacitors based on the time duration. The processing circuitry is further configured to determine whether the ratio of capacitances of the first set of capacitors or second set of capacitors is within an error tolerance of a target ratio. The processing circuitry is further configured to set a flag in a register based on determining whether the ratio of capacitances of the first set of capacitors and the second set of capacitors is within the error tolerance of the target ratio.

Example 19

The device of examples 11-18 or any combination thereof, wherein the processing circuitry is further configured to determine a ratio of capacitances of the first set of capacitors and second set of capacitors based on the time duration. The processing circuitry is also configured to determine whether the ratio of capacitances of the first set of capacitors or second set of capacitors is within an error tolerance of a target ratio. The processing circuitry is configured to store the ratio of capacitances of the first set of capacitors and the second set of capacitors in a memory device. The processing circuitry is further configured to modify a result of an analog-to-digital conversion based on the stored ratio of capacitances.

Example 20

A device including a first set of capacitors and a second set of capacitors, wherein the first set of capacitors is electrically connected to the second set of capacitors by a common node. The device further includes discharge circuitry electrically connected to the common node, and processing circuitry configured to set a voltage at the common node to an offset voltage. The processing circuitry is further configured to control a first set of switches to deliver a first voltage signal through the first set of capacitors to the common node. The processing circuitry is also configured to control a second set of switches to deliver a second voltage signal through the second set of capacitors to the common node, wherein the second voltage signal includes an opposing polarity to the first voltage signal. The processing circuitry is configured to control the discharge circuitry to discharge the common node by a number of voltage steps to the offset voltage. The processing circuitry is further configured to count the number of voltage steps and determine a ratio of capacitances of the first set of capacitors and the second set of capacitors based on the number of voltage steps.

Various examples of the disclosure have been described. Any combination of the described systems, operations, or functions is contemplated. These and other examples are within the scope of the following claims.

What is claimed is:

1. A method comprising:
controlling a first set of switches to deliver a first voltage signal through a first set of capacitors to a common node;
controlling a second set of switches to deliver a second voltage signal through a second set of capacitors to the common node, wherein the first set of capacitors is electrically connected to the second set of capacitors by the common node, and wherein the second voltage signal includes an opposing polarity to the first voltage signal; and
measuring a time duration to discharge the common node.

2. The method of claim 1, wherein:
controlling the first set of switches comprises switching a second node of the first set of capacitors from a first reference voltage to a second reference voltage; and
controlling the second set of switches comprises switching a second node of the second set of capacitors from the second reference voltage to a first reference voltage.

3. The method of claim 1, further comprising controlling discharge circuitry to discharge the common node by a number of voltage steps, wherein the discharge circuitry is electrically connected to the common node, and wherein measuring the time duration comprises counting the number of voltage steps.

4. The method of claim 3, wherein controlling the discharge circuitry to discharge the common node comprises:
controlling a first discharge switch of the discharge circuitry to selectively electrically connect the common node to a first node of a discharge capacitor of the discharge circuitry; and
controlling a second discharge switch of the discharge circuitry to selectively electrically connect the first node of the discharge capacitor to a reference voltage.

5. The method of claim 1, further comprising controlling discharge circuitry to discharge the common node by controlling an electrical bus to supply an electrical current to the common node or sink an electrical current from the common node, wherein the discharge circuitry is electrically connected to the common node.

6. The method of claim 1, further comprising controlling discharge circuitry to discharge the common node by electrically connecting the common node to a resistor, wherein the discharge circuitry is electrically connected to the common node.

7. The method of claim 1, further comprising setting a voltage at the common node to an offset voltage before controlling the first set of switches to deliver the first voltage signal and before controlling the second set of switches to deliver the second voltage signal, wherein measuring the time duration comprises determining a time duration to discharge an electrical charge at the common node caused by the first voltage signal and the second voltage signal.

8. The method of claim 1, further comprising:
determining a ratio of capacitances of the first set of capacitors and the second set of capacitors based on the time duration; and
determining whether the ratio of capacitances of the first set of capacitors and the second set of capacitors is within an error tolerance of a target ratio.

9. The method of claim 8, further comprising:
setting a flag in a register based on determining whether the ratio of capacitances of the first set of capacitors and the second set of capacitors is within the error tolerance of the target ratio; and
outputting a warning based on the flag.

10. The method of claim 8, further comprising:
storing the ratio of capacitances of the first set of capacitors and the second set of capacitors in a memory device; and
modifying a result of an analog-to-digital conversion based on the stored ratio of capacitances.

11. A device comprising:
a first set of capacitors;
a second set of capacitors, wherein the first set of capacitors is electrically connected to the second set of capacitors by a common node; and
processing circuitry configured to:

control a first set of switches to deliver a first voltage signal through the first set of capacitors to the common node;

control a second set of switches to deliver a second voltage signal through the second set of capacitors to the common node, wherein the second voltage signal includes an opposing polarity to the first voltage signal; and measure a time duration to discharge the common node.

12. The device of claim 11, wherein:

the processing circuitry is configured to control the first set of switches by at least switching a second node of the first set of capacitors from a first reference voltage to a second reference voltage; and the processing circuitry is configured to control the second set of switches by at least switching a second node of the second set of capacitors from the second reference voltage to the first reference voltage.

13. The device of claim 11, further comprising discharge circuitry electrically connected to the common node, wherein the processing circuitry is further configured to:

control the discharge circuitry to discharge the common node by a number of voltage steps; and count the number of voltage steps.

14. The device of claim 13, wherein the discharge circuitry comprises a discharge capacitor, a first discharge switch, and a second discharge switch, and wherein the processing circuitry is further configured to:

control the first discharge switch to selectively electrically connect the common node to a first node of the discharge capacitor; and control the second discharge switch to selectively electrically connect the first node of the discharge capacitor to a reference voltage.

15. The device of claim 11, further comprising discharge circuitry electrically connected to the common node, wherein the processing circuitry is further configured to control the discharge circuitry to discharge the common node by controlling an electrical bus to supply an electrical current to the common node or sink an electrical current from the common node.

16. The device of claim 11, further comprising discharge circuitry electrically connected to the common node, wherein the processing circuitry is further configured to control the discharge circuitry to discharge the common node by electrically connecting the common node to a resistor.

17. The device of claim 11, wherein the processing circuitry is further configured to set a voltage at the common node to an offset voltage before controlling the first set of switches to deliver the first voltage signal and before controlling the second set of switches to deliver the second voltage signal, the device further comprising a comparator configured to detect when the voltage at the common node has discharged to the offset voltage, wherein the processing circuitry is configured to measure the time duration by at least determining a time duration to discharge an electrical charge at the common node caused by the first voltage signal and the second voltage signal to the offset voltage.

18. The device of claim 11, wherein the processing circuitry is further configured to:

determine a ratio of capacitances of the first set of capacitors and second set of capacitors based on the time duration;

determine whether the ratio of capacitances of the first set of capacitors or second set of capacitors is within an error tolerance of a target ratio; and set a flag in a register based on determining whether the ratio of capacitances of the first set of capacitors and the second set of capacitors is within the error tolerance of the target ratio.

19. The device of claim 11, wherein the processing circuitry is further configured to:

determine a ratio of capacitances of the first set of capacitors and second set of capacitors based on the time duration;

determine whether the ratio of capacitances of the first set of capacitors or second set of capacitors is within an error tolerance of a target ratio;

store the ratio of capacitances of the first set of capacitors and the second set of capacitors in a memory device; and modify a result of an analog-to-digital conversion based on the stored ratio of capacitances.

20. A device comprising:

a first set of capacitors;

a second set of capacitors, wherein the first set of capacitors is electrically connected to the second set of capacitors by a common node;

discharge circuitry electrically connected to the common node; and processing circuitry configured to:

set a voltage at the common node to an offset voltage;

control a first set of switches to deliver a first voltage signal through the first set of capacitors to the common node;

control a second set of switches to deliver a second voltage signal through the second set of capacitors to the common node, wherein the second voltage signal includes an opposing polarity to the first voltage signal;

control the discharge circuitry to discharge the common node by a number of voltage steps to the offset voltage;

count the number of voltage steps; and determine a ratio of capacitances of the first set of capacitors and the second set of capacitors based on the number of voltage steps.

* * * * *